US008557093B2

(12) United States Patent
Cousins et al.

(10) Patent No.: US 8,557,093 B2
(45) Date of Patent: Oct. 15, 2013

(54) DEPOSITION SYSTEM WITH ELECTRICALLY ISOLATED PALLET AND ANODE ASSEMBLIES

(75) Inventors: Peter Cousins, Muntinlupa (PH); Hsin-Chiao Luan, Palo Alto, CA (US); Thomas Pass, San Jose, CA (US); John Ferrer, Calamba (PH); Rex Gallardo, Sta. Rosa (PH); Stephen F. Meyer, Santa Clara, CA (US)

(73) Assignee: SunPower Corporation, San Jose, CA (US)

( * ) Notice: Subject to any disclaimer, the term of this patent is extended or adjusted under 35 U.S.C. 154(b) by 1393 days.

(21) Appl. No.: 11/726,894

(22) Filed: Mar. 22, 2007

(65) Prior Publication Data
US 2008/0230372 A1 Sep. 25, 2008

(51) Int. Cl.
*C23C 14/00* (2006.01)
(52) U.S. Cl.
USPC ............ 204/298.14; 204/298.25; 204/298.26; 204/298.15; 118/500
(58) Field of Classification Search
USPC ............ 204/298.14, 298.15, 298.25, 298.26; 118/500
See application file for complete search history.

(56) References Cited

U.S. PATENT DOCUMENTS

| | | | | |
|---|---|---|---|---|
| 3,977,955 A | * | 8/1976 | Nevis et al. ............... | 204/192.32 |
| 4,512,841 A | * | 4/1985 | Cunningham et al. ... | 156/345.43 |
| 4,973,975 A | * | 11/1990 | Yamazaki et al. ............ | 341/122 |
| 5,092,978 A | * | 3/1992 | Kojima et al. ........... | 204/298.15 |
| 5,106,474 A | * | 4/1992 | Dickey et al. ........... | 204/298.14 |
| 5,814,196 A | * | 9/1998 | Hollars et al. ........... | 204/298.15 |
| 5,891,311 A | * | 4/1999 | Lewis et al. ............. | 204/192.12 |
| 2005/0022861 A1 | | 2/2005 | Rose et al. | |

FOREIGN PATENT DOCUMENTS

| | | |
|---|---|---|
| JP | 64-073076 A | 3/1989 |
| JP | 01240647 A * | 9/1989 |
| JP | 09-111448 A | 4/1997 |
| KR | 100501044 B1 | 7/2005 |

OTHER PUBLICATIONS

Translation to Suzuki (JP 01-240647) published Sep. 1989.*
International Search Report and Written Opinion of the International Searching Authority, PCT/US08/001872 filed Feb. 12, 2008, mailed Jun. 27, 2008.
Kurdex Sputtering (PVD) Product Information, downloaded Mar. 22, 2007, http://www.kurdex.com/product_1.html, one page.
International Preliminary Report on Patentability from PCT/US2008/001872 mailed Oct. 1, 2009, 8 pgs.
First Office Action from Chinese Patent Application No. 200880009301.3 mailed Nov. 25, 2010, 8 pgs.

\* cited by examiner

*Primary Examiner* — John Brayton
(74) *Attorney, Agent, or Firm* — Blakely Sokoloff Taylor Zafman LLP

(57) ABSTRACT

A system for substrate deposition. The system includes a wafer pallet and an anode. The wafer pallet has a bottom and a top. The top of the wafer pallet is configured to hold a substrate wafer. The anode has a substantially fixed position relative to the wafer pallet and is configured to move with the wafer pallet through the deposition chamber. The anode is electrically isolated from the substrate wafer.

10 Claims, 12 Drawing Sheets

DEPOSITION SYSTEM WITH ELECTRICALLY ISOLATED PALLET AND ANODE ASSEMBLIES

TECHNICAL FIELD

This invention relates to the field of substrate deposition and, in particular, to a pass-through deposition system with an anode electrically isolated from a substrate wafer.

BACKGROUND

Deposition systems are used to deposit a substance on a substrate. Several types of conventional deposition systems are currently implemented. One type of conventional deposition system implements magnetron sputtering. Sputtering, in general, is the process of ejecting atoms from a solid target material, the target or cathode, to deposit a thin film on a substrate. A magnetron enhances this operation by generating strong electric and magnetic fields to trap electrons and improve the formation of ions from gaseous neutrals such as argon. The ions impact the target and cause target material to eject and deposit on the substrate. During operation, an electric current may flow from the sputtering cathode to anode assemblies within the deposition system.

While some sputtering deposition systems use a cathode with a fixed anode (i.e., in a fixed position relative to the cathode), other sputtering deposition systems implement an anode that moves relative to the cathode. It should be noted that, while there may be multiple components of the deposition system which act as anodes, there may be a primary anode based on its relative area and proximity to the cathode. Hence, references herein to the anode generally refer to this type of primary anode, unless indicated otherwise. As an example of a moving primary anode, some deposition systems use a moving pallet to hold the substrates, and this pallet also acts as the primary anode during operation. In this way, the primary anode moves relative to the cathode, because the cathode is stationery within the deposition chamber, as the wafer pallet acting as anode moves into and out of the deposition chamber. In this type of system, where the anode moves relative to the cathode, several problems can occur.

One problem occurs where the substrate and the pallet, which carries the substrate, act as the primary anode. This problem derives from the failure to provide a consistent anode within the deposition chamber which results in a damaged substrate and in unstable cathode operation. The inconsistency is apparent where the wafer pallet and substrates form the primary anode and where there is intermittent electrical contact between the wafer pallet and the substrate, usually through the edge of the substrate. In this scenario, the pallet is typically coupled to ground and an intermittent electrical current may flow from the substrate to the pallet in the form of an electrical arc, resulting in heat. This discharge can damage the substrate, damage a device on the substrate, melt a deposited layer, or create a metal alloy from multiple deposition layers on the substrate. Consequently, the original material does not function in the same manner as the altered material. As an example, the altered material cannot be chemically processed (i.e., it does not etch away) so that subsequent patterning techniques fail. This failure of the patterning techniques results in failure of the device as exemplified by electrical shorts within the device.

BRIEF DESCRIPTION OF THE DRAWINGS

The present invention is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the spirit and scope of the present invention.

A system for substrate deposition is described. The system includes a wafer pallet and an anode. The wafer pallet has a bottom and a top. The top of the wafer pallet is configured to hold a substrate wafer. The anode has a substantially fixed position relative to the wafer pallet and is electrically isolated from the substrate wafer. In one embodiment, the anode is integral with, or otherwise connected to, a transport carrier which holds the wafer pallet, so that the anode, transport carrier, and wafer pallet all move together through the deposition system. In some embodiments the transport carrier carries the wafer pallet along a substantially linear transport path through a deposition chamber. Additionally, in some embodiments, the system is a pass-through deposition system in which the wafer pallet passes through the deposition chamber one or more times. Each time the wafer pallet passes through the deposition chamber, the wafer pallet makes a single pass by a deposition source. In contrast, a planetary deposition system continuously rotates the substrate wafer within the deposition chamber so that the substrate wafers repetitively pass by the deposition source within the deposition chamber.

Certain embodiments of the method, apparatus, and system described herein address disadvantages of the conventional deposition technologies. Some embodiments address an arcing problem. Some embodiments eliminate the formation of metal alloys between deposited layers. Some embodiments can be used with any planar magnetron within a moving or fixed pallet system. Some embodiments enable potential biasing of substrate wafers. Some embodiments allow for easy maintenance of an anode surface without permanently mounting an anode in front of the cathode (in which case, the anode would be subject to heavy deposition buildup). It should be noted, however, that the embodiments described herein are not limited to addressing these specific problems.

Figure 1:
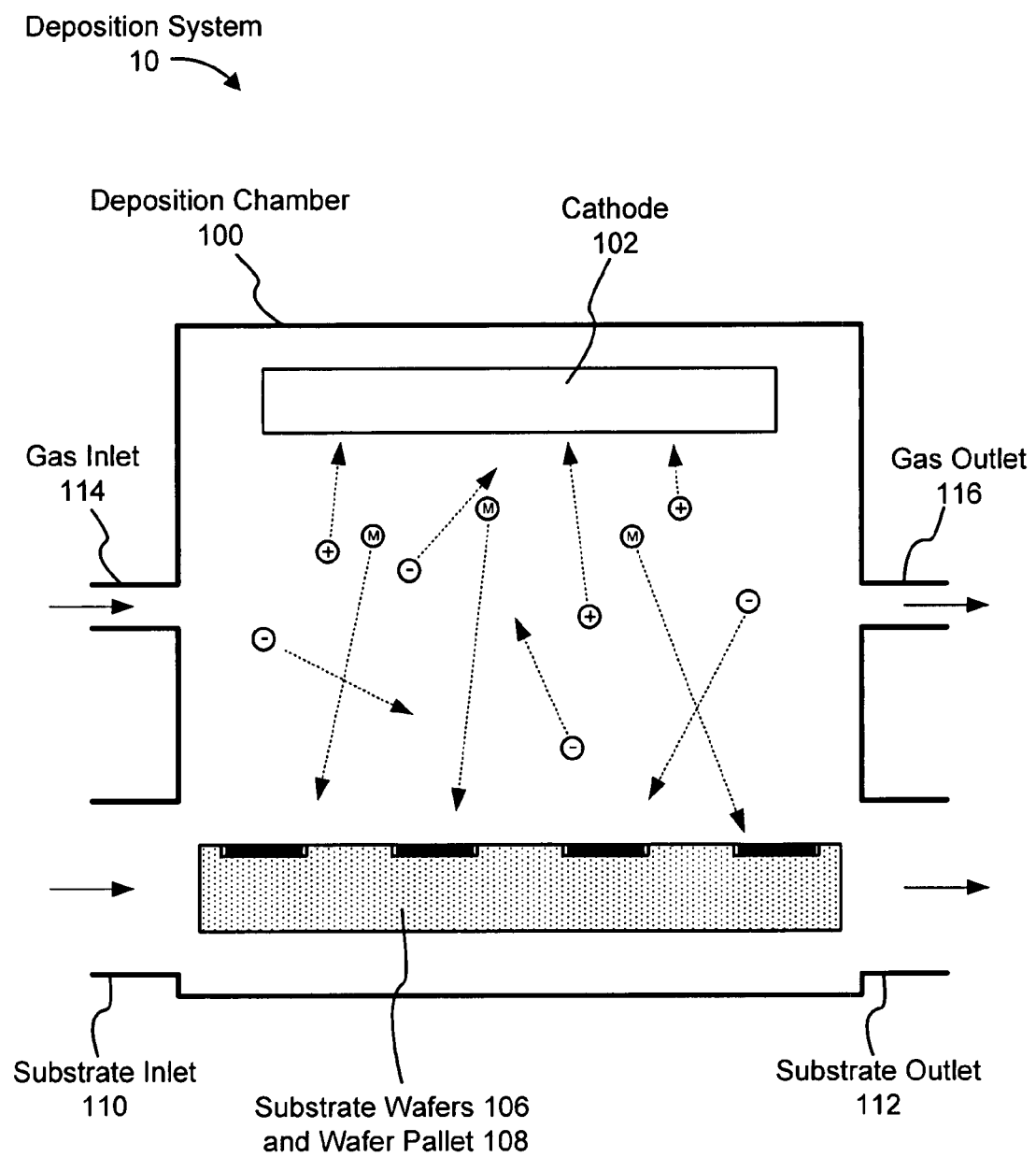
FIG. 1 illustrates one embodiment of a deposition system.

FIG. 1 illustrates one embodiment of a deposition system 10. As an example, the deposition system 10 may be a pass-through deposition system. The illustrated deposition system 10 includes a deposition chamber 100. A cathode 102 inside the deposition chamber 100 includes a deposition material (designated with an "M") such as a target to be deposited, via sputter gas ions (designated with a "+"), onto one or more substrate wafers 106. In one embodiment, the cathode 102 is coupled to a magnetron sputter source (not shown) which is used to generate strong electromagnetic fields around the cathode 102 to produce collisions resulting in the sputter gas ions. The sputter gas ions impact the cathode and cause target material to eject and deposit on the surface of the substrate wafers 106. The deposition material is also deposited on other surfaces throughout the deposition chamber 100 because of the vacuum within the deposition chamber 100. Exemplary deposition materials for the target include aluminum (Al), titanium tungsten (TiW), and copper (Cu), although other deposition materials may be used. The sputter gas ions 104 are typically argon ions, or ions from another inert gas. However, some embodiments of the deposition system 10 may implement reactive operations such as $O_2$ and $N_2$ processes for oxides and nitrides. The substrate wafers 106 may be any material on which the deposition material may be deposited.

Embodiments of the deposition system 10 implement different types of cathodes 102. Embodiments which use a magnetron sputter source may or may not include a corresponding fixed anode (i.e., fixed relative to the cathode 102), and one or more other components of the deposition system 10 which can act as anodes. In other words, in implementations which do not include a primary anode which is in a fixed position relative to the cathode 102, one or more anodes are formed by other components of the deposition system 10.

In one embodiment, the substrate wafers 106 are transported through the deposition chamber 100 by a wafer pallet 108. The deposition chamber 100 is configured to allow the wafer pallet 108 to enter the deposition chamber 100 through a substrate inlet 110 and to exit the deposition chamber 100 through a substrate outlet 112. For example, the wafer pallet 108 may move along a track (not shown) that automatically transports the wafer pallet 108 through the deposition chamber 100. Alternatively, the substrate wafers 106 may be manually inserted into and removed from the deposition chamber 100. Additionally, the deposition chamber 100 includes a gas inlet 114 and a gas outlet 116 to allow the sputter gas (e.g., argon) to enter and exit the deposition chamber 100. Other embodiments of the deposition system 10 may include additional components or features known in the art.

Figure 2:
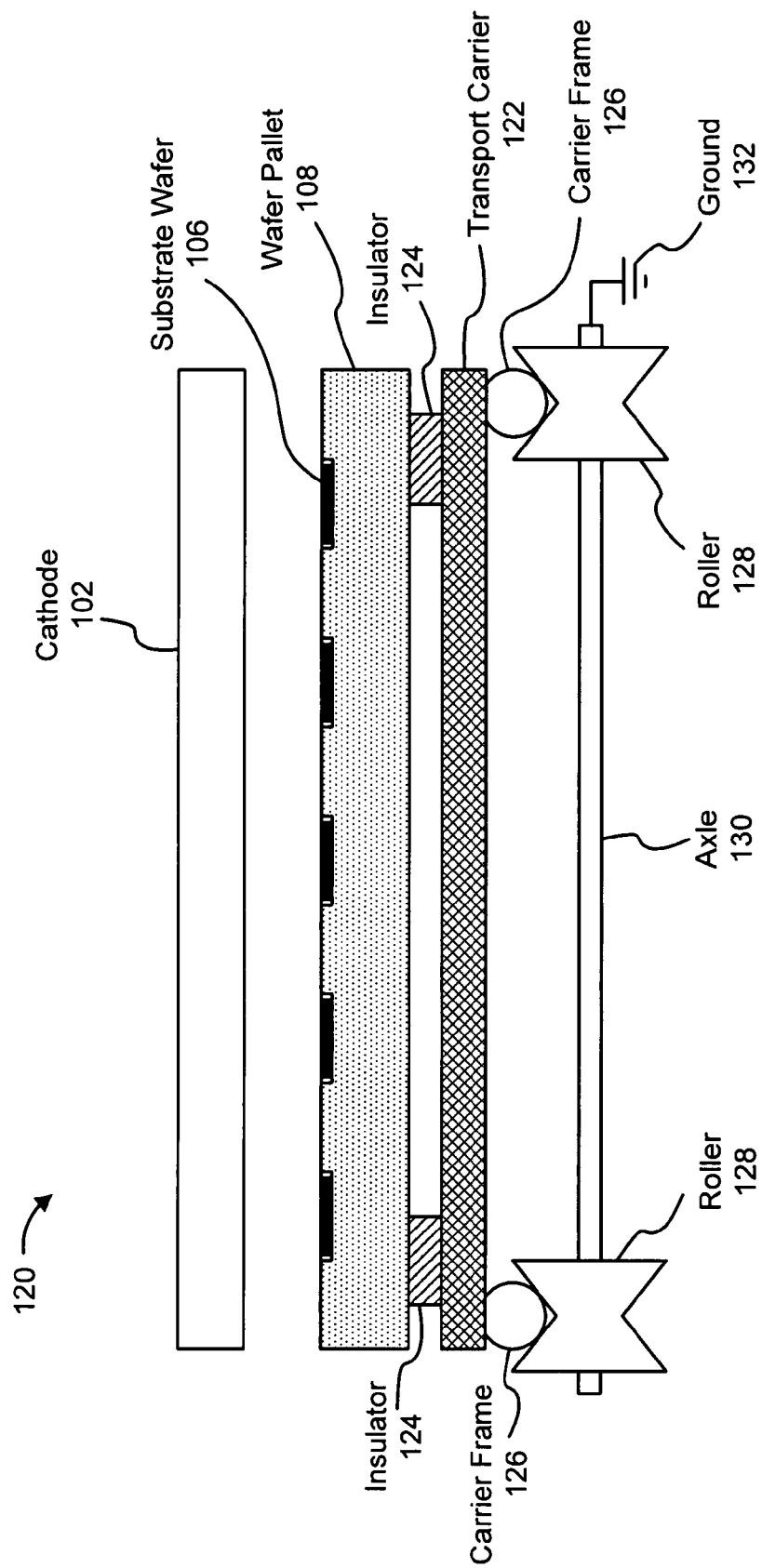
FIG. 2 illustrates a cross section of one embodiment of a deposition system with an isolated wafer pallet.

FIG. 2 illustrates a cross section of one embodiment of a deposition system 120 with an isolated wafer pallet 108. However, as will be explained below, embodiments of the illustrated deposition system 120 may be inadequate to address the problems described above. The illustrated deposition system 120 includes a cathode 102 positioned relative to one or more substrate wafers 106 on the wafer pallet 108. The deposition system 120 also includes a transport carrier 122 to transport the wafer pallet 108 and substrate wafers 106 through the deposition chamber 100. The transport carrier 122 sits on carrier frames 126 which, in turn, rest on a roller track including, for example, rollers 128 and an axle 130. Alternatively, other types of rollers, belts, linear rails, or other tracks may be used. For convenience, references to the rollers 128 or roller track are merely used as exemplary language and do not preclude embodiments of the deposition system 120 using other types of transportation mechanisms.

In the depicted embodiment, the transport carrier 122 is electrically connected to a ground reference 132 through the roller track assembly. The wafer pallet 108 is isolated from the transport carrier 122 by one or more insulators 124 and, hence, these insulators 124 isolate the wafer pallet 108 and substrate wafers 106 from the grounded reference 132. As an example, the insulators 124 may be ceramic insulators, although other types of insulating materials may be implemented.

In one embodiment, electrically isolating the wafer pallet 108 and substrate wafers 106 from the ground reference 132 mitigates the formation of metal alloys along the edges of the substrate wafers 106. Since the wafer pallet 108 and the substrate wafers 106 are maintained at the same electrical potential, there is no current discharge between the wafer pallet 108 and the edges of the substrate wafers 106. Thus, since there is no electrical current flowing between the wafer pallet 108 and the substrate wafers 106, there is no electrical arcing, no heat, and no creation of a metal alloy from the separate layers deposited on the substrate wafer 106.

However, the configuration of the illustrated deposition system 120 may present some difficulties. The embodiment shown in FIG. 2 may be designated as a "floating pallet" implementation because the wafer pallet 108 is electrically isolated (i.e., floating) and is no longer connected to the ground reference 132. It is possible that the floating pallet implementation may result in deposition uniformity problems. In other words, the operation of the cathode 102 may become unstable and the deposition material may be unevenly deposited on the substrate wafers 106. More specifically, because the grounded transport carrier 122 is electrically isolated from the floating (i.e., ungrounded) wafer pallet 108, the wafer pallet 108 can no longer act as the primary anode to the cathode 102 and the electrical circuit is insufficient. Thus, the illustrated deposition system 120 may exhibit cathode instability during operation due to the electrical shielding of the grounded transport carrier 122. This cathode instability presents problems with the deposition system 120.

Figure 3:
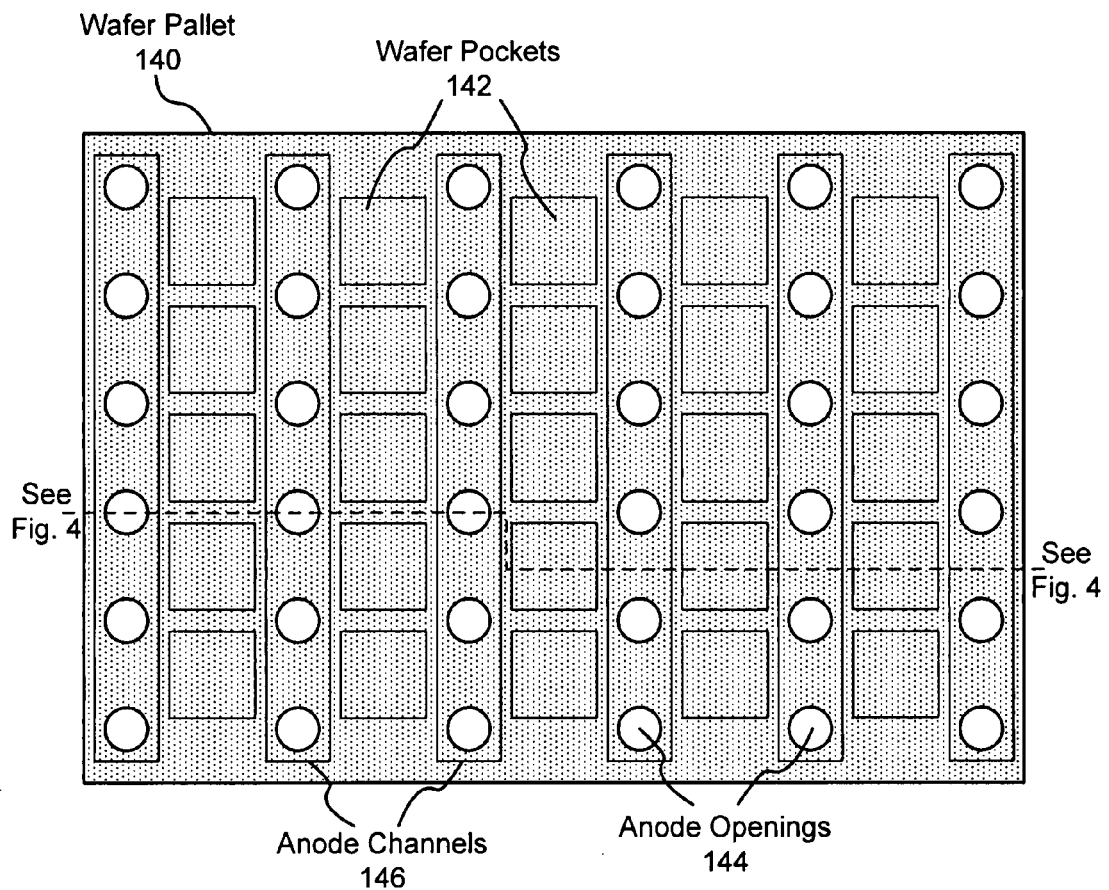
FIG. 3 illustrates a top view of one embodiment of a wafer pallet for use with an isolated anode.
Figure 4:
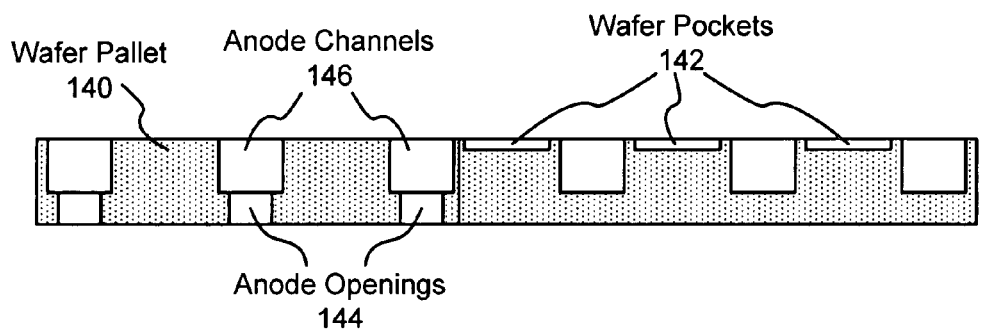
FIG. 4 illustrates a cross section of the wafer pallet of FIG. 3, taken along the line indicated in FIG. 3.

FIG. 3 illustrates a top view of one embodiment of a wafer pallet 140 for use with an isolated anode. FIG. 4 illustrates a cross section of the wafer pallet 140 of FIG. 3, taken along the line indicated in FIG. 3. The illustrated wafer pallet 140 includes a plurality of wafer pockets 142. Each wafer pocket 142 is a depression, or cavity, in the top surface of the wafer pallet 140. However, in other embodiments, the wafer pallet 140 could be constructed without the wafer pockets 142, in which case the wafer pallet 140 may include a flat surface and a number of pins or clips to hold the substrate wafers 106 in a predefined arrangement.

In the illustrated embodiment, the wafer pockets 142 are sized to allow substrate wafers 106 to be inserted into corresponding wafer pockets 142. The wafer pockets 142 are also designed to allow the substrate wafers 106 to maintain direct contact with the wafer pallet 140. In one embodiment, the dimensions of the wafer pockets 142 are slightly larger than the dimensions of the substrate wafers 106 so that the tops of the substrate wafers 106 are slightly below the top of the wafer pallet 140. Alternatively, the depth of the wafer pockets 142 may be the same as or slightly less than the depth of the substrate wafers 106 to allow the tops of the substrate wafers 106 to be at or above the top of the wafer pallet 140. In another embodiment, the wafer pallet 108 may include another mechanism to hold the substrate wafers 106. For example, vertical pins may be used with or independently of the wafer pockets 142.

The illustrated wafer pallet 140 also includes one or more anode channels 146. Each anode channel 146 is a depression, or cavity, in the top surface of the wafer pallet 140. However, other embodiments of the wafer pallet 140 may omit the anode channels 146, as discussed below. In the depicted embodiment, the anode channels 146 do not overlap the wafer pockets 142. In one embodiment, the anode channels 146 run parallel to one another across the length (or width) of the wafer pallet 140. Each of the anode channels 146 also includes at least one anode opening 144. In one embodiment, the anode opening 144 is a hole, or void, through the wafer pallet 140 (e.g., from the top surface to the bottom surface). Although the anode openings 144 and anode channels 146 are shown with particular shapes (e.g., circles and rectangles), other implementation may employ other shapes for the anode openings 144 and anode channels 146. The purpose of the anode openings 144 and the anode channels 146 is described in more detail with reference to FIGS. 5 and 6.

Figure 5:
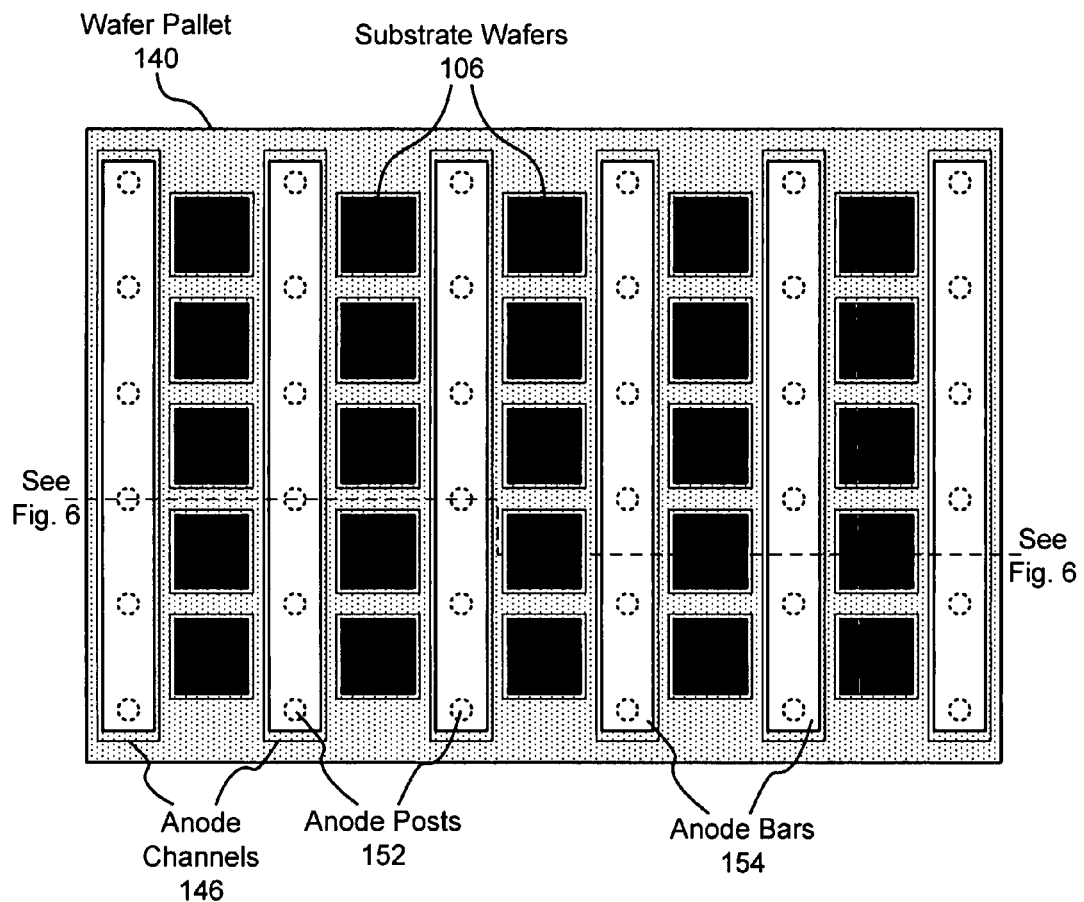
FIG. 5 illustrates a top view of the wafer pallet of FIG. 3, with substrate wafers and anode bars in place.

FIG. 5 illustrates a top view of the wafer pallet 140 of FIG. 3, with substrate wafers 106 and anode bars 154 in place. In particular, FIG. 5 shows an embodiment in which the substrate wafers 106 are located within the wafer pockets 142, and the dimensions of the wafer pockets 142 are slightly larger than the dimensions of the substrate wafers 106. Similarly, the dimensions of the anode channels 146 are larger than the dimensions of the anode bars 154 so that the anode bars 154 remain electrically isolated from the wafer pallet 140. The anode bars 152 serve as anodes to the sputtering cathode 102. Although the anode bars 154 are shown having a rectangular shape, in both the plan and sectional view, some embodiments may utilize anode bars 154 having non-rectangular shapes such as triangular, circular, or a non-canonical shape in either plan or sectional view. The anode bars 152 and anode channels 146 are sized and shaped to accommodate the substrate wafers 106 without causing deposition shadowing of the substrate wafers 106, which may cause uneven deposition on the substrate wafers 106.

In one embodiment, each anode bar 154 is coupled to the transport carrier 122 by one or more anode posts 152 (shown dashed below the anode bars 154). These anode posts 152 and the anode bars 154 may be of the same or different conductive material. As an example, the anode posts 152 and anode bars 154 may be fabricated using steel, although other conductive materials may be used. By electrically coupling the anode posts 152 and the anode bars 154 to the transport carrier 122 and, hence, the ground reference 132, the anode bars 154 serve as anodes for the cathode 102. The location of the anode bars 154 between rows (or columns) of substrate wafers 106 may facilitate a substantially even deposit of the deposition material on the various substrate wafers 106.

Figure 6:
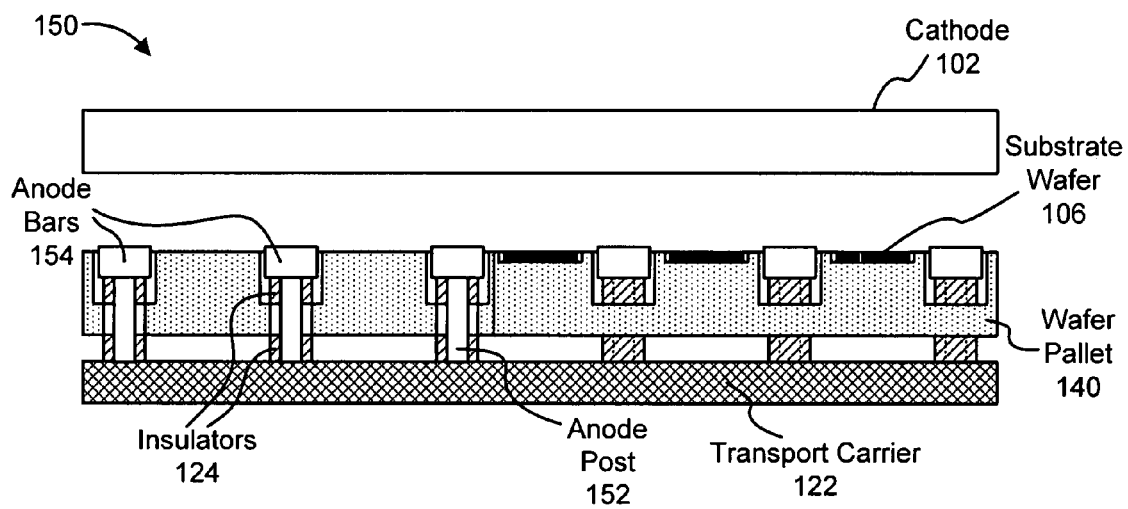
FIG. 6 illustrates a cross section of an embodiment of a deposition system with the wafer pallet of FIG. 3.

FIG. 6 illustrates a cross section of an embodiment of a deposition system 150 with the wafer pallet 140 of FIG. 3. In particular, the depicted deposition system 150 includes the wafer pallet 140, a cathode 102, and a transport carrier 122. The cross section shows the anode bars 154 physically and electrically coupled to the anode posts 152 which, in turn, are physically and electrically coupled to the transport carrier 122. In one embodiment, the anode bars 154 are mounted to extend slightly above the top surface of the wafer pallet 140. This configuration may affect anode performance. Alternatively, the anode bars 154 may be mounted so that the tops of the anode bars 154 are even with or below the top surface of the wafer pallet 140.

In one embodiment, the anode posts 152 may be rigidly fixed to the anode bars 154. Additionally, the anode posts 152 may be temporarily or permanently coupled to the anode bars 154. Some exemplary fasteners for coupling the anode posts 152 to the anode bars 154 include screws, adhesive (e.g., conductive adhesive), locking mechanisms, or other types of fasteners. Similarly, the anode posts 152 may be rigidly fixed and permanently or temporarily coupled to the transport carrier 122 using similar fasteners. Coupling the anode posts 152 to the anode bars 154 and the transport carrier 122 using temporary fasteners may facilitate disassembly of the anode posts 152 from the anode bars 154 and the transport carrier 122 so that, for example, the anode bars 154 and the anode posts 152 may be cleaned on occasion.

In one embodiment, electrical insulators 124 may be used between the wafer pallet 140 and the transport carrier 122 in order to provide electrical isolation between the wafer pallet 140 and the transport carrier 122. Similarly, the deposition system 150 may include insulators 124 within the anode channels 146. The insulators 124 in the anode channels 146 may help to maintain electrical isolation between the wafer pallet 140 and the anode posts 152 and/or between the wafer pallet 140 and the anode bars 154.

In one embodiment, the insulators 124 in the anode channels 146 may be sized so that they are substantially covered by the anode bars 154 or wafer pallet 140. In this way, the anode bars 154 or wafer pallet 140 may protect the insulators 124 to a degree so that a relatively small amount of deposition material is deposited on the insulators 124. Over time, it may be useful to clean the insulators 124 to remove any deposition material deposited on the insulators 124 so that the deposition material does not create a short circuit between the anode bars 154 and the wafer pallet 140.

Figure 7:
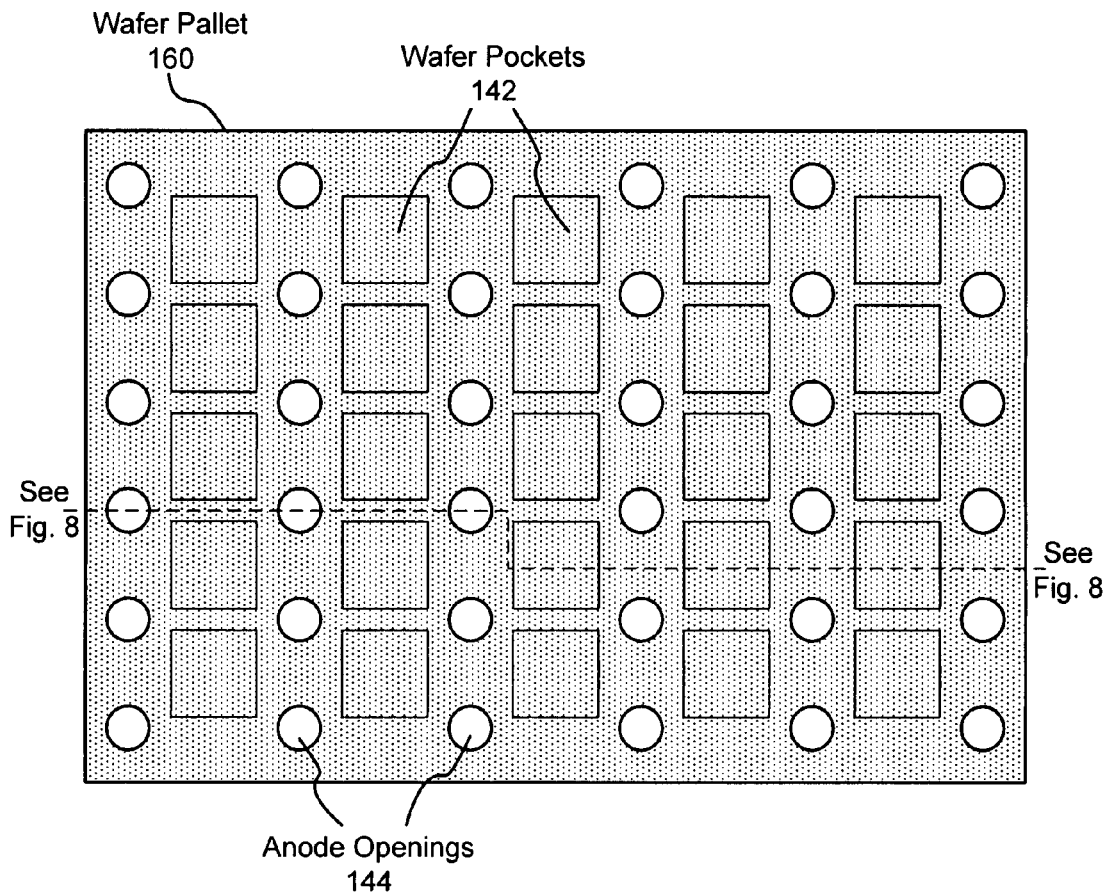
FIG. 7 illustrates a top view of another embodiment of a wafer pallet for use with anode posts.
Figure 8:
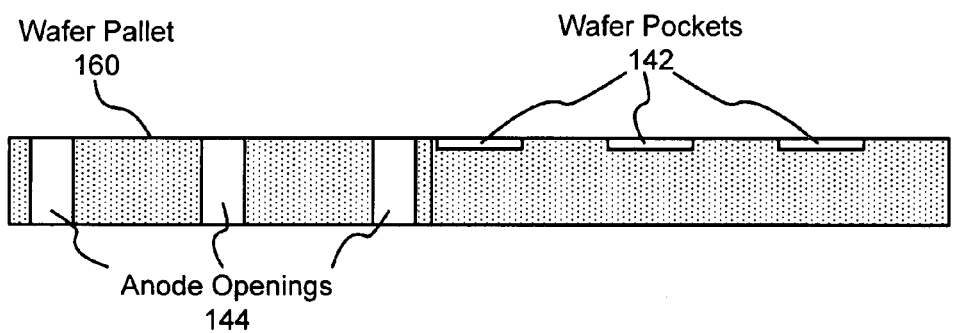
FIG. 8 illustrates a cross section of the wafer pallet of FIG. 7, taken along the line indicated in FIG. 7.

FIG. 7 illustrates a top view of another embodiment of a wafer pallet 160 for use with anode posts 152. FIG. 8 illustrates a cross section of the wafer pallet 160 of FIG. 7, taken along the line indicated in FIG. 7. The depicted wafer pallet 160 is substantially similar to the wafer pallet 140 of FIG. 4, except that the wafer pallet 160 of FIG. 7 does not include anode channels 146. Instead, the anode openings 144 extend from the top of the wafer pallet 160 to the bottom of the wafer pallet 160.

Figure 9:
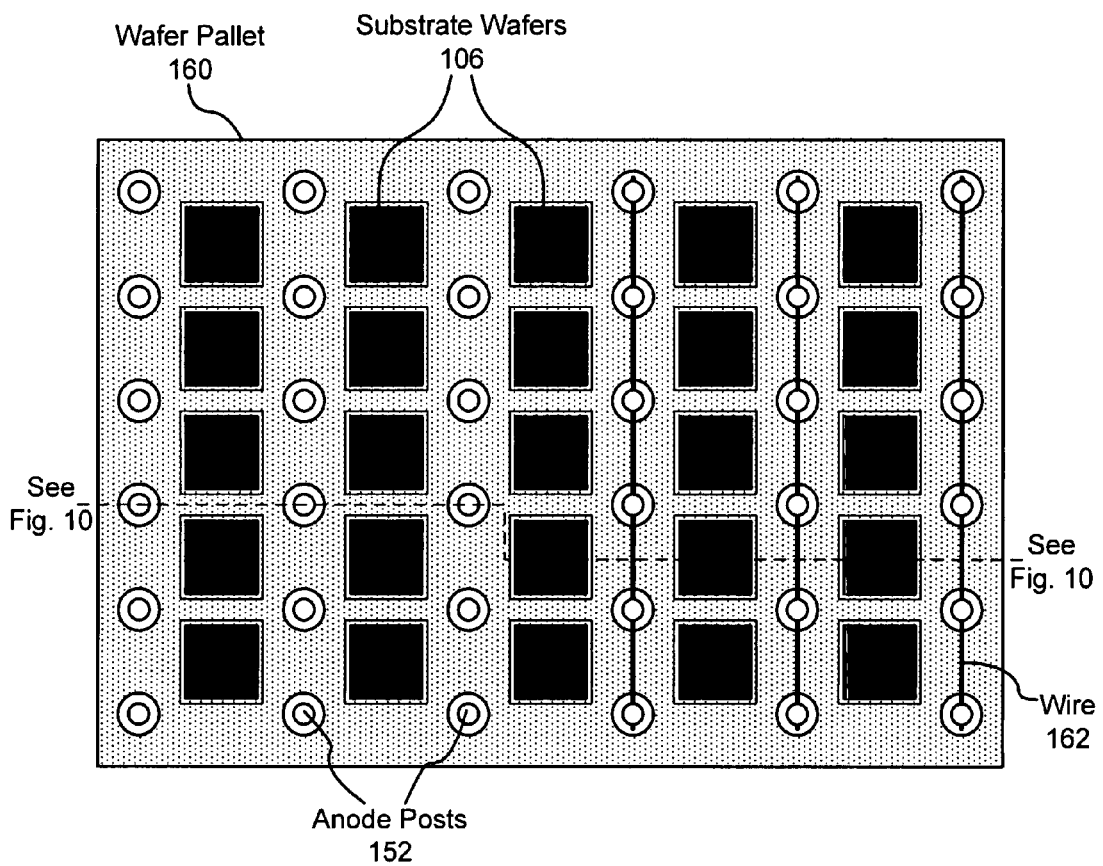
FIG. 9 illustrates a top view of the wafer pallet of FIG. 7, with substrate wafers and anode posts in place.
Figure 10:
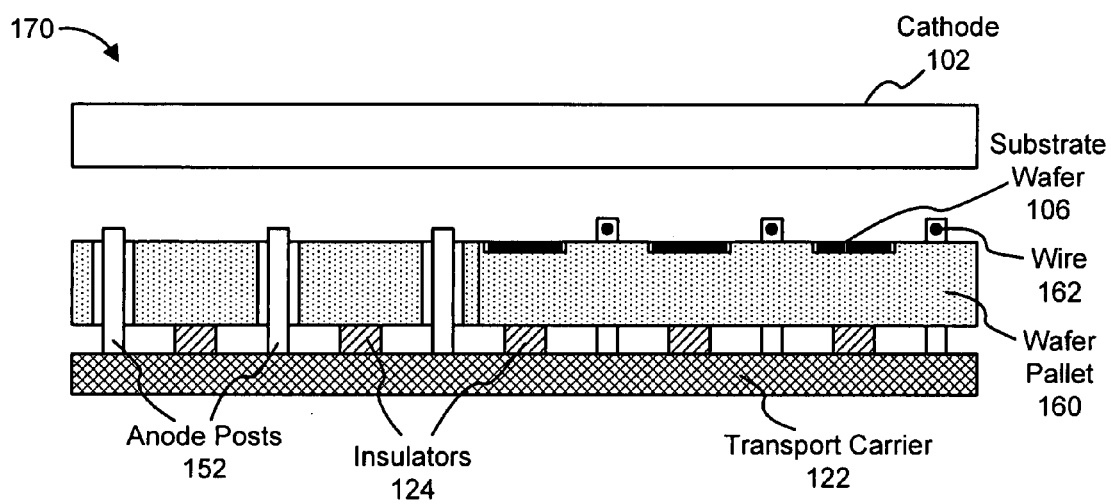
FIG. 10 illustrates a cross section of an embodiment of a deposition system with the wafer pallet of FIG. 7.

FIG. 9 illustrates a top view of the wafer pallet 160 of FIG. 7, with substrate wafers 106 and anode posts 152 in place. FIG. 10 illustrates a cross section of an embodiment of a deposition system 170 with the wafer pallet 160 of FIG. 7. As shown in FIGS. 9 and 10, the anode openings 144 extend from the top of the wafer pallet 160 to the bottom of the wafer pallet 160. The anode posts 152 also extend through the thickness of the wafer pallet 160. In one embodiment, the anode posts 152 extend beyond the top of the wafer pallet 160. Alternatively, the tops of the anode posts 152 may be even with or below the top surface of the wafer pallet 160. In another embodiment, anode bars 154 may be mounted on the tops of the anode posts 152, above the top surface of the wafer pallet 160. In another embodiment, a wire 162 or other conductive object may be attached to the posts 152. The wire 162 provides a similar functionality as the anode bars 154, but the dimensions of the wire 162 may provide less obstruction for the deposition material to deposit on the substrate wafers 106. Although wires 162 are only shown on some of the anode posts 152, other embodiments may include wires on all of the anode posts 152, on alternating rows of anode posts 152, or in another configuration. The anode posts 152 may be fastened to the transport carrier 122, as described above.

FIG. 10 also shows a plurality of insulators 124 located between the wafer pallet 160 and the transport carrier 122. As described above, the insulators 124 electrically isolate the wafer pallet 160 from the transport carrier 122 so that the electrical potential of the wafer pallet 160 can be maintained or controlled separately from the electrical potential of the transport carrier 122 and the anode posts 152, as well as any anode bars 154 or wires 162. In one embodiment, the locations of the insulators 124 may be designed to provide a relatively long pathway for any deposition material to reach the insulators 124 (e.g., through the anode openings 142 and between the wafer pallet 160 and transport carrier 122.

FIG. 10 also depicts one embodiment of the wire 162 attached to the anode posts 152. In particular, some of the anode posts 152 extend above the wafer pallet 160 a sufficient distance so that the wire 162 may be threaded through the top ends of the anode posts 152. In another embodiment, the wire 162 may be threaded through the anodes posts 152 at a level below the top surface of the wafer pallet 160 within, for example, an anode channel 146, as described above.

Figure 11:
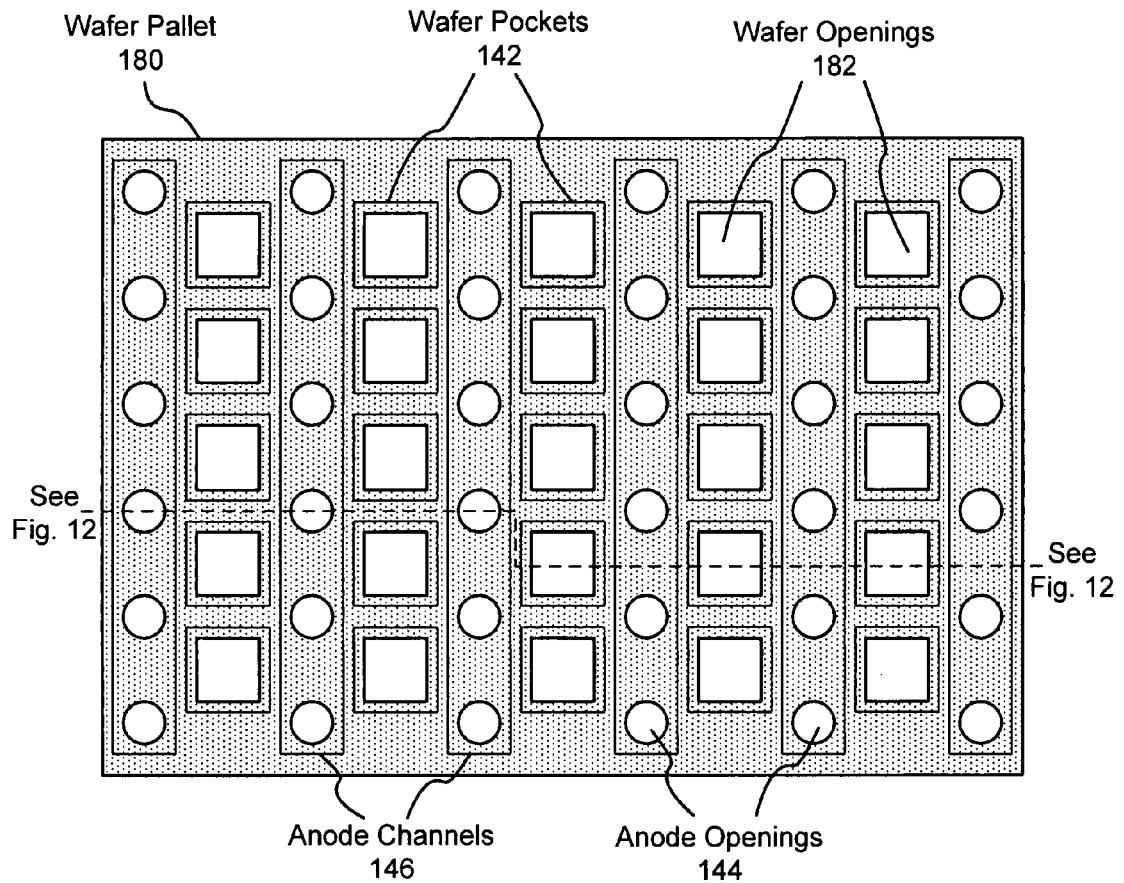
FIG. 11 illustrates a top view of another embodiment of a wafer pallet with wafer openings.
Figure 12:
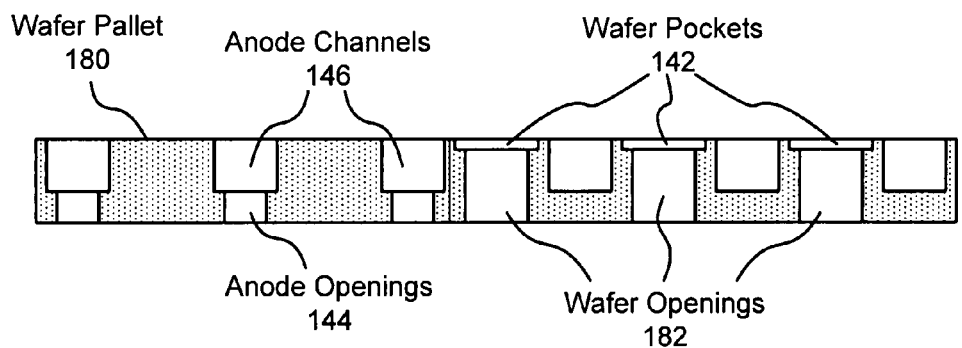
FIG. 12 illustrates a cross section of the wafer pallet of FIG. 11, taken along the line indicated in FIG. 11.

FIG. 11 illustrates a top view of another embodiment of a wafer pallet 180 with wafer openings 182. FIG. 12 illustrates a cross section of the wafer pallet 180 of FIG. 11, taken along the line indicated in FIG. 11. The depicted wafer pallet 180 is substantially similar to the wafer pallet 140 of FIG. 4, except that the wafer pallet 180 of FIG. 11 includes wafer openings 182. Each of the wafer openings 182 is a hole, or void, aligned with a corresponding wafer pocket 142. In one embodiment, the dimensions of the wafer opening 182 are smaller than the dimensions of the wafer pocket 142 so that a perimeter surface is present within the wafer pocket 142 to support the corresponding substrate wafer 106. Additionally, the wafer openings 182 may facilitate loading the substrate wafers 106 into the wafer pockets 142, by allowing a loading mechanism to extend through the wafer pallet 180 and lower the substrate wafers 106 into the wafer pockets 142. In other words, a loading mechanism may extend through the wafer opening 182 to a point above the surface of the wafer pallet 180, a user or another loading mechanism may place a substrate wafer 106 on the loading mechanism, and the loading mechanism then lowers the substrate wafer 106 into the wafer pocket 142 as the loading mechanism is retracted from the wafer opening 182. Additionally, the wafer openings 182 may facilitate venting of the gasses within the deposition chamber 100.

Figure 13:
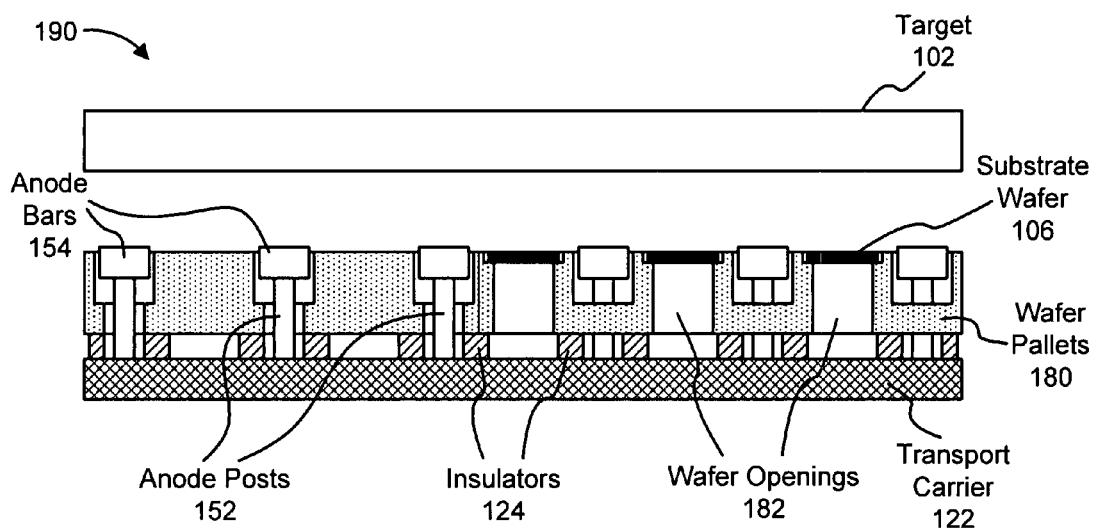
FIG. 13 illustrates a cross section of an embodiment of a deposition system with the wafer pallet of FIG. 11.

FIG. 13 illustrates a cross section of an embodiment of a deposition system 190 with the wafer pallet 180 of FIG. 11. In particular, the depicted deposition system 190 includes the wafer pallet 180, a cathode 102, and a transport carrier 122. The cross section shows the anode bars 154 coupled to the anode posts 152 which, in turn, are coupled to the transport carrier 122. In one embodiment, the anode bars 154 are mounted to extend slightly above the top surface of the wafer pallet 180. This configuration may affect anode performance. Alternatively, the anode bars 154 may be mounted so that the tops of the anode bars 154 are even with or below the top surface of the wafer pallet 180.

Figure 14:
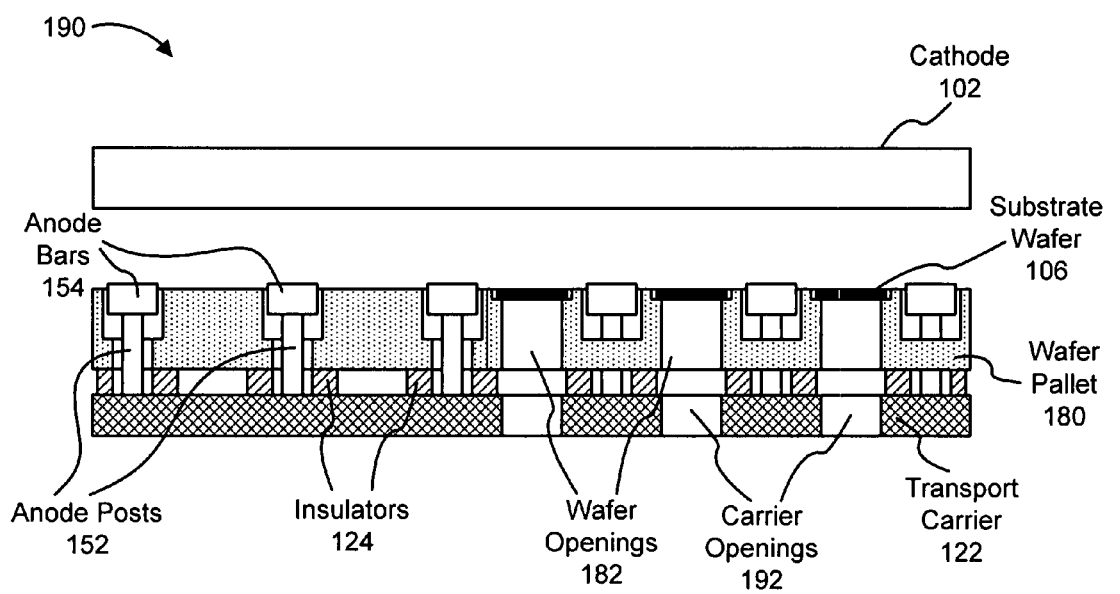
FIG. 14 illustrates a cross section of the deposition system of FIG. 13, including a transport carrier with access openings.

FIG. 14 illustrates a cross section of the deposition system 190 of FIG. 13, including a transport carrier 122 with carrier openings 192. In particular, the transport carrier 122 includes carrier openings 192 which are aligned with the wafer openings 182 in the wafer pallet 180. In one embodiment, the carrier openings 192 have the same dimensions as the wafer openings 182. Alternatively, the carrier openings 192 may be larger or smaller than the wafer openings 182.

Figure 15:
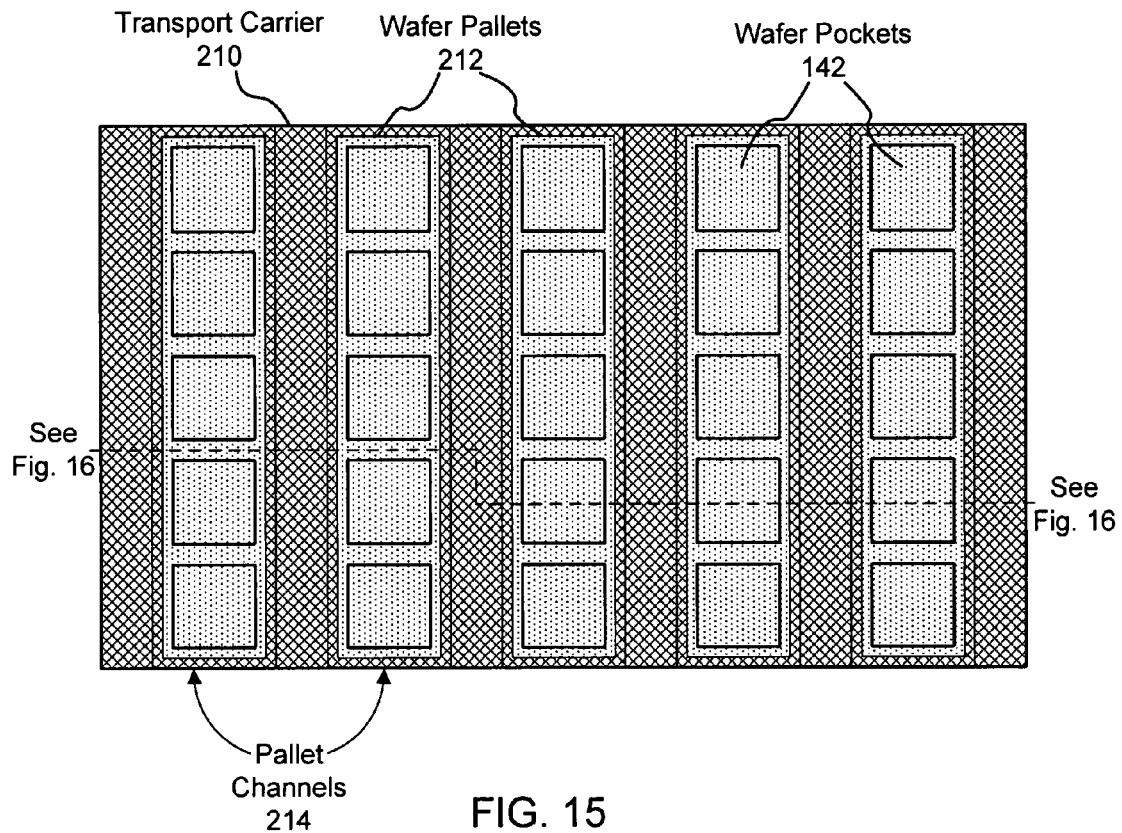
FIG. 15 illustrates a top view of one embodiment of a transport carrier with integrated anodes.
Figure 16:
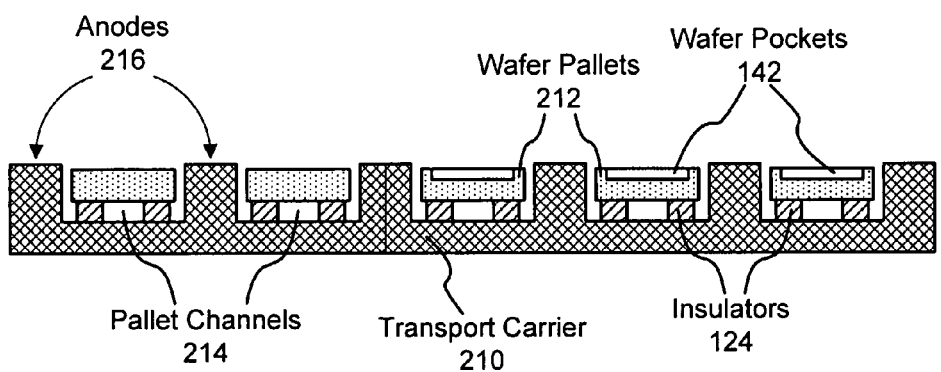
FIG. 16 illustrates a cross section of the transport carrier of FIG. 15, taken along the line indicated in FIG. 15.

FIG. 15 illustrates a top view of one embodiment of a transport carrier 210 with integrated anodes 216. FIG. 16 illustrates a cross section of the transport carrier 210 of FIG. 15, taken along the line indicated in FIG. 15. The depicted transport carrier 210 includes one or more pallet channels 214 which are positioned substantially parallel to each other along the length (or width) of the transport carrier 210. Each pallet channel 214 is sized to allow individual wafer pallets 212 to be located within the corresponding pallet channels 214. In this way, the "pallet" may have more than one piece (i.e., individual wafer pallets 212). In one embodiment, the dimensions of the pallet channels 214 are slightly larger than the dimensions of the wafer pallets 212. However, some embodiments may include pallet channels 214 with a depth to allow the wafer pallets 212 to be even with or above the top surface of the transport carrier 210. Similar to some of the embodiments above, insulators 124 may be located between the transport carrier 210 and each wafer pallet 212.

The integrated anodes 216 correspond to the exposed, top surface portions of the transport carrier 210. In other words, the anodes 216 are formed by and are a part of the transport carrier 210. Since the anodes 216 of the transport carrier 210 are exposed during the deposition process, some of the deposition material may be deposited on the transport carrier 210.

Figure 17:
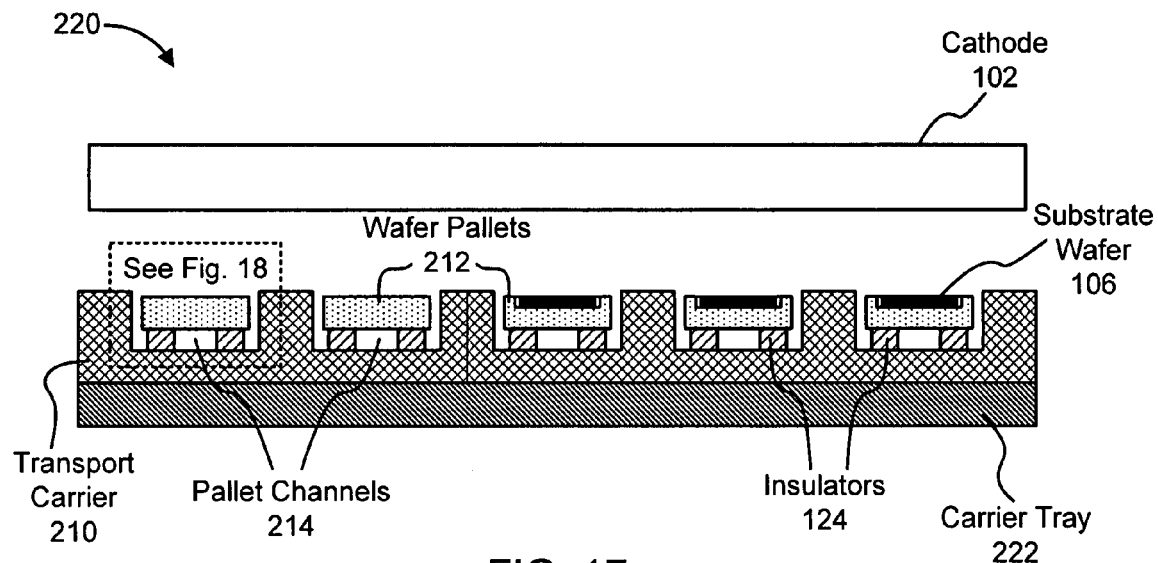
FIG. 17 illustrates a cross section of an embodiment of a deposition system with the transport carrier of FIG. 15.

FIG. 17 illustrates a cross section of an embodiment of a deposition system 220 with the transport carrier 210 of FIG. 15. The depicted deposition system 220 includes a cathode 102, the transport carrier 220, and a carrier tray 222. In one embodiment, the carrier tray 222 is an additional component to facilitate movement of the substrate wafers 106 through the deposition system 220. Using the carrier tray 222 may facilitate continued use of the deposition system 220 if the transport carrier 210 is removed to be cleaned. For example, the carrier tray 222 may be continuously used with various transport carriers 210.

Figure 18:
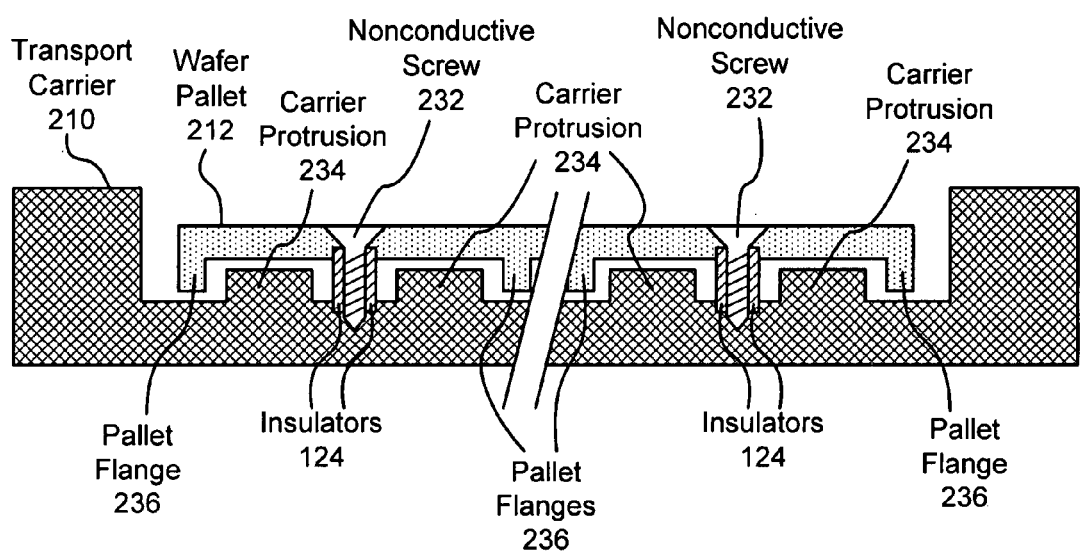
FIG. 18 illustrates a cross section of a more detailed embodiment of the transport carrier and wafer pallet of FIG. 15.

FIG. 18 illustrates a cross section of a more detailed embodiment of the transport carrier 210 and wafer pallet 212 of FIG. 15. In particular, FIG. 18 shows an enlarged embodiment of how the wafer pallet 212 is coupled to the transport carrier 210 in FIG. 17. Although a particular coupling implementation is shown and described herein, the wafer pallet 212 may be coupled to and electrically isolated from the transport carrier 210 differently in other embodiments.

In one embodiment, the wafer pallet 212 is coupled to the transport carrier 210 by one or more fasteners. One exemplary type of fastener is a non-conductive screw 232, although other types of fasteners may be used. Additionally, an insulator 124 may be used as a spacer between the wafer pallet 212 and the transport carrier 210. The insulator 124 also may protect the non-conductive screw 232 from accumulating deposition material.

Another way to limit the amount of deposition material that might be deposited on the non-conductive screw 232 or insulator 124 is to implement carrier protrusions 234 on the transport carrier 210, or pallet flanges 236 on the wafer pallet 212, or both. In one embodiment, the carrier protrusions 234 extend outward from the transport carrier 210 and toward the wafer pallet 212. Similarly, the pallet flanges 236 extend away from the wafer pallet 212 and toward the transport carrier 210. In one embodiment, the pallet flanges 236 are slightly offset from the carrier protrusions 234 in order to increase the relative path length from the edges of the wafer pallet 212 to the non-conductive screw 232 and insulator 124.

In some embodiments, the insulators 124 include protection features to limit coating by the deposition material. Exemplary structures which may be used to prevent or reduce accumulation of the deposition material on the insulators 124 include baffles and pockets. In particular, baffles define narrow gaps (e.g., air gaps) between, for example, a top baffle and a lower baffle. A baffle structure increases or maximizes the path (by limiting or minimizing the directness of the pathway) of the plasma to the insulators 124. Alternatively, the insulators 124 may be recessed in pockets. Using these or similar structures reduces deposition buildup that could otherwise electrically bridge the insulators 124.

Figure 19:
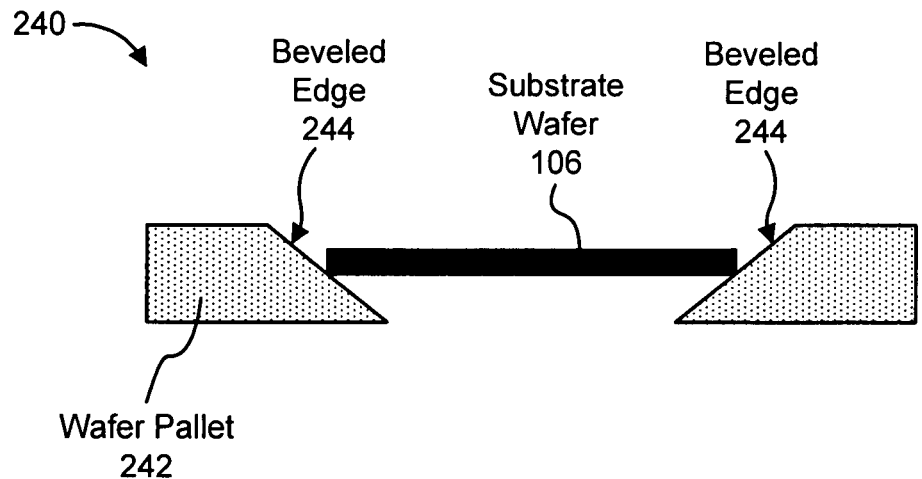
FIG. 19 illustrates one embodiment of a mounting configuration for a substrate wafer in a wafer pallet.

FIG. 19 illustrates one embodiment of a mounting configuration 240 for a substrate wafer 106 in a wafer pallet 242. The depicted wafer pallet 242 includes beveled edges 244 at one or more sides where the substrate wafer 106 contacts the wafer pallet 242. In some embodiments, implementing the beveled edges 244 helps to maintain physical contact between the substrate wafer 106 and the wafer pallet 242 in order to maintain a consistent electrical potential between the substrate wafer 106 and the wafer pallet 106.

Figure 20:
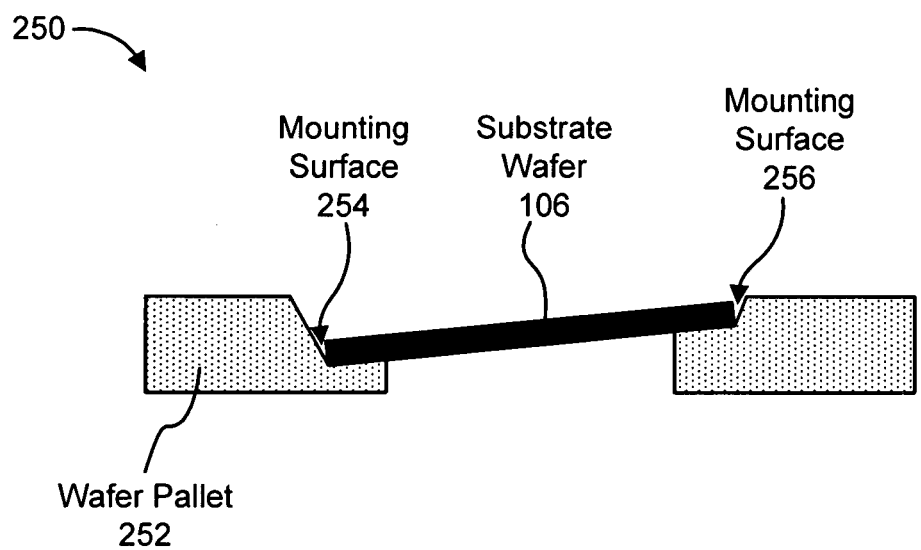
FIG. 20 illustrates another embodiment of a mounting configuration for a substrate wafer in a wafer pallet.

FIG. 20 illustrates another embodiment of a mounting configuration 250 for a substrate wafer 106 in a wafer pallet 252. The depicted wafer pallet 252 includes asymmetrical, or uneven, mounting surfaces 254 and 256. By placing the substrate wafer 106 at the angled position established by the asymmetrical mounting surfaces 254 and 256, the weight of the substrate wafer 106 on the lower surface may help to maintain physical contact between the substrate wafer 106 and the wafer pallet 252. As described above, maintaining physical contact between the substrate wafer 106 and the wafer pallet 252 keeps the substrate wafer 106 at the same electrical potential as the wafer pallet 252 so that there is no electrical arcing, heating, or formation of metal alloys.

Figure 21:
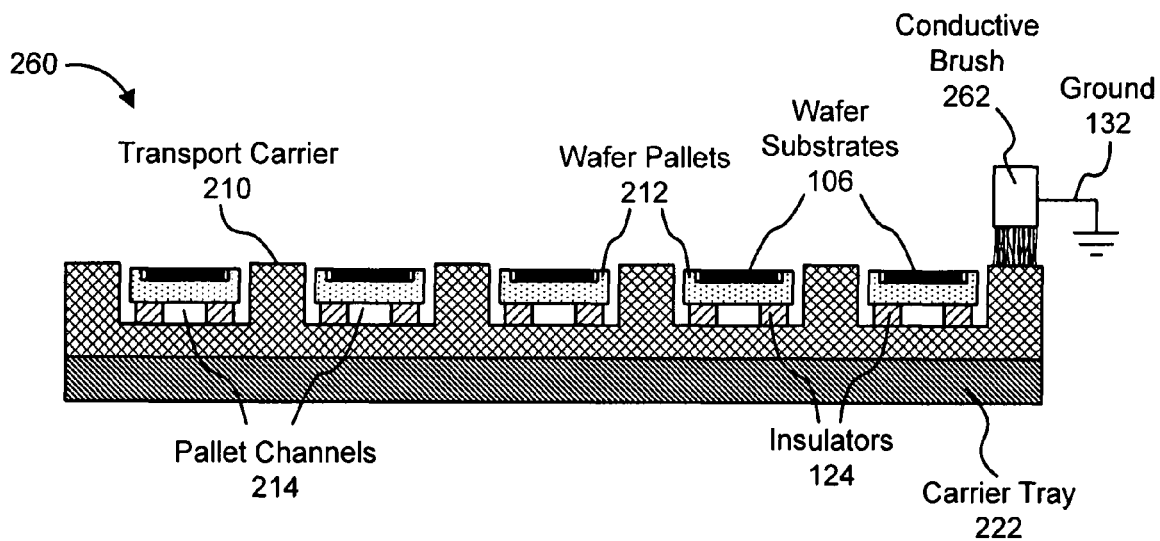
FIG. 21 illustrates one embodiment of a grounding system.

FIG. 21 illustrates one embodiment of a grounding system 260. The depicted grounding system 260 may be implemented to couple the transport carrier 210 to the ground reference 132 without coupling the ground reference 132 directly to the transport assembly (e.g., rollers or linear rails). In one embodiment, the ground reference 132 is coupled to a conductive brush 262 such as a metal wire brush which brushes along the top surface (e.g., an integrated anode 216) of the transport carrier 210. For example, the conductive brush 262 may be in a fixed position relative to the deposition chamber 100, so that the conductive brush 262 maintains physical contact with the transport carrier 210 as the transport carrier 210 travels through the deposition chamber 100. In another embodiment, the anode bars 154 electrically contact intermittent electrical potential sources such as fixed wheels or sliding guides.

Figure 22:
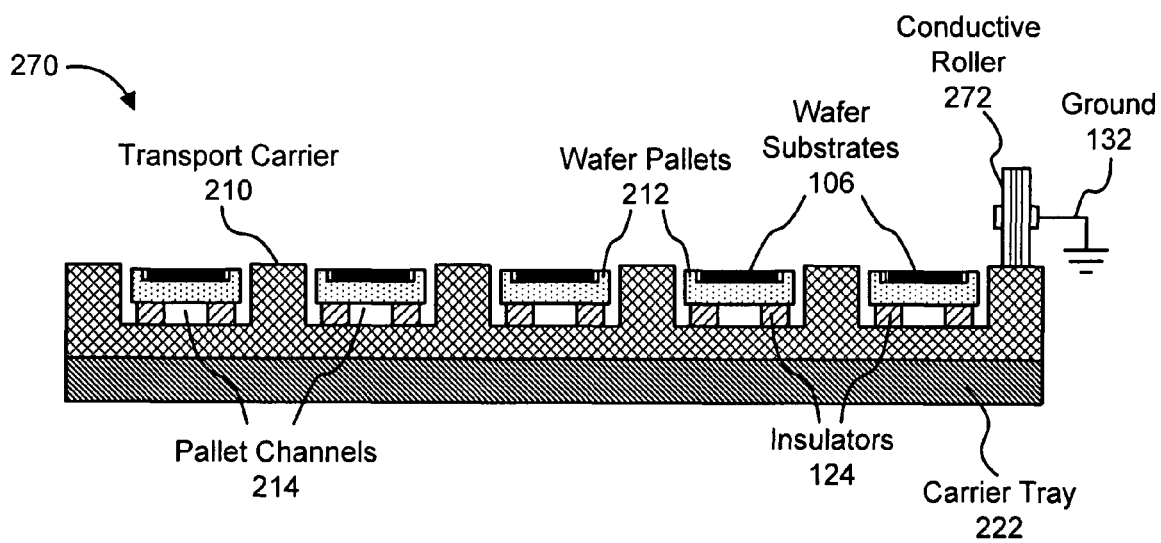
FIG. 22 illustrates another embodiment of a grounding system.

FIG. 22 illustrates another embodiment of a grounding system 270. The grounding system 270 is substantially similar to the grounding system 260 of FIG. 21, except that the grounding system 270 of FIG. 22 uses a conductive roller 272 rather than a conductive brush 262. In one embodiment, the conductive roller 272 rolls along the top surface (e.g., an integrated anode 216) of the transport carrier 210 as the transport carrier 210 travels through the deposition chamber 100. Alternatively, other types of conductive devices may be used to couple the transport carrier 210 to the ground reference 132.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

Also, it should be noted that, although the previous description describes the deposition system 10 using a sputter magnetron source, other embodiments may be applicable to other types of deposition sources which generate current to the wafer pallet and used the wafer pallet to operate as part of the deposition source. For example, remote sources, ion sources, ion-assisted deposition (IAD), plasma enhanced chemical vapor deposition (PECVD), and other types of sources and deposition processes may implement various embodiments.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A pass-through deposition system, comprising: a wafer pallet having a body with a bottom surface and a top surface, the top surface of the body of the wafer pallet to hold a substrate wafer in direct contact with a portion of the body of the wafer pallet to maintain the substrate wafer at substantially the same electrical potential as the wafer pallet, wherein the wafer pallet is for moving with the substrate wafer through the pass-through deposition system;

and an anode having a substantially fixed position relative to the wafer pallet so that the anode is configured to move with the wafer pallet, wherein the anode is electrically isolated from the portion of the body of the wafer pallet that is to be in direct contact with the substrate wafer; and wherein the wafer pallet comprises an anode opening from the bottom to the top of the wafer pallet, wherein the anode opening is dimensioned to allow the anode to pass through the anode opening without touching the wafer pallet; and wherein the anode comprises an electrically conductive post and an electrically conductive bar, the electrically conductive bar coupled to the electrically conductive post, wherein the electrically conductive bar is not shielded from a deposition source; and wherein the wafer pallet further comprises an anode channel dimensioned to allow the electrically conductive bar to at least partially recess into the top of the wafer pallet, wherein the anode channel comprises a sidewall to maintain a substantially consistent air gap between the electrically conductive bar and post of the anode and the sidewall of the anode channel.

2. The system of claim 1, further comprising a transport carrier to carry the wafer pallet through a deposition chamber, the deposition chamber containing the deposition source.

3. The system of claim 2, wherein the transport carrier carries the wafer pallet through the deposition chamber along a substantially linear transport path.

4. The system of claim 2, further comprising an insulator coupled between the wafer pallet and the transport carrier, wherein the anode is electrically coupled to the transport carrier and electrically isolated from the wafer pallet.

5. The system of claim 4, wherein the anode comprises a raised portion of the transport carrier, the anode located approximately adjacent to the wafer pallet.

6. The system of claim 2, wherein the transport carrier comprises a carrier opening approximately at a location corresponding to a wafer opening of the wafer pallet.

7. The system of claim 1, wherein the wafer pallet further comprises:
   a wafer pocket on the top surface of the body of the wafer pallet, the wafer pocket to hold the substrate wafer; and
   a wafer opening from the bottom surface to the top surface of the body of the wafer pallet approximately at the wafer pocket.

8. The system of claim 7, wherein the wafer pocket comprises at least one beveled edge on which to mount a corresponding side of the substrate wafer.

9. The system of claim 7, wherein the wafer pocket comprises an uneven mounting configuration to hold the substrate wafer at a non-zero angle relative to the top of the wafer pallet.

10. The system of claim 1, further comprising a grounding device electrically coupled to the anode and to a ground reference, wherein the grounding device comprises a conductive roller, a conductive brush, or a carrier track.

\* \* \* \* \*